US006711048B2

(12) United States Patent
Chien

(10) Patent No.: US 6,711,048 B2
(45) Date of Patent: Mar. 23, 2004

(54) 2-PORT MEMORY DEVICE

(76) Inventor: Pien Chien, No. 50, Alley 111, Lane 155, Sec. 3, Keelung Rd., Taipei (TW)

( * ) Notice: Subject to any disclaimer, the term of this patent is extended or adjusted under 35 U.S.C. 154(b) by 0 days.

(21) Appl. No.: 10/134,277

(22) Filed: Apr. 25, 2002

(65) Prior Publication Data

US 2002/0161977 A1 Oct. 31, 2002

Related U.S. Application Data

(60) Provisional application No. 60/286,395, filed on Apr. 25, 2001, provisional application No. 60/301,691, filed on Jun. 27, 2001, provisional application No. 60/301,637, filed on Jun. 27, 2001, provisional application No. 60/300,000, filed on Jun. 21, 2001, provisional application No. 60/300,483, filed on Jun. 22, 2001, provisional application No. 60/318,793, filed on Sep. 10, 2001, and provisional application No. 60/324,794, filed on Sep. 24, 2001.

(51) Int. Cl.[7] .......................... G11C 11/22; G11C 11/24; G11C 7/00
(52) U.S. Cl. .................... 365/145; 365/149; 365/222
(58) Field of Search ................ 365/145, 149, 365/222

(56) References Cited

U.S. PATENT DOCUMENTS

| 5,224,069 | A | * | 6/1993 | Natori | 365/145 |
| 5,285,292 | A | * | 2/1994 | Matsuki | 365/145 |
| 5,416,735 | A | * | 5/1995 | Onishi et al. | 365/145 |
| 6,067,244 | A | * | 5/2000 | Ma et al. | 365/145 |
| 6,166,945 | A | * | 12/2000 | Choi et al. | 365/145 |
| 6,341,082 | B2 | * | 1/2002 | Hosoi | 365/145 |
| 6,459,626 | B1 | * | 10/2002 | Bohm et al. | 365/145 |
| 6,538,914 | B1 | * | 3/2003 | Chung | 365/145 |

* cited by examiner

Primary Examiner—Trong Phan
(74) Attorney, Agent, or Firm—J. C. Patents

(57) ABSTRACT

A 2-port memory device is provided. The 2-port memory device is necessary to be periodically refreshed to maintain the data stored in cells of the memory device. The memory device can be accessed by read/write operation and a refresh operation without any interference with each other. Such device can provide a very high speed accessing and the operating frequency of the memory device can be easily increased significantly.

7 Claims, 11 Drawing Sheets

2-PORT MEMORY DEVICE

CROSS-REFERENCE TO RELATED APPLICATION

This application claims the priority benefits of U.S. provisional application titled "HIGH SPEED MULTI-PORT MEMORY DEVICE" filed on Apr. 25, 2001, Ser. No. 60/286,395, U.S. provisional application titled "HIGH SPEED MULTI-PORT MEMORY DEVICE" filed on Jun. 27, 2001, Ser. No. 60/301,691, U.S. patent application titled "OPERATION METHOD OF A SRAM DEVICE" filed on Jan. 14, 2002, Ser. No. 10/047,765, U.S. provisional application titled "1-T SRAM" filed on Jun. 27, 2001, Ser. No. 60/301,637, U.S. patent application titled "CONTENT ADDRESSABLE MEMORY (CAM) APPARATUS AND A METHOD OF OPERATING THE SAME" filed on Jun. 26, 2001, Ser. No. 09/899,555, U.S. provisional application titled "CONTENT ADDRESSABLE MEMORY (CAM) CELL" filed on Jun. 21, 2001, Ser. No. 60/300,000, U.S. provisional application titled "CONTENT ADDRESSABLE MEMORY (CAM) CELL" filed on Jun. 22, 2001, Ser. No. 60/300,483, U.S. provisional application titled "CONTENT ADDRESSABLE MEMORY (CAM) CELL" filed on Sep. 10, 2001, Ser. No. 60/318,793 and U.S. provisional application titled "CONTENT ADDRESSABLE MEMORY (CAM) CELL" filed on Sep. 24, 2001, Ser. No. 60/324,794. All disclosures of these applications are incorporated herein by reference.

BACKGROUND OF THE INVENTION

1. Field of the Invention

The present invention relates to an operation method of an SRAM (Static Random Access Memory) device. More particularly, the present invention relates to an operation of a SRAM, which can efficiently perform read/write accessing operations and refresh operation for such SRAM device.

2. Description of the Related Art

Some conventional semiconductor memories, such as dynamic random access memory (DRAM), must be periodically refreshed in order to retain valid data. During refresh operations, external accessing data typically is not allowed. In addition, a mechanism is required to inform the memory controller that the DRAM is performing a refresh operation. Any pending memory transaction has to be delayed until the refresh operation is completed. Refresh operations therefore lengthen the overall access time for memory accesses. It is therefore important to design a memory system in which the impact of refresh operations on external memory access is minimized.

SUMMARY OF THE INVENTION

The present invention provides a 2-port memory device, which is necessary periodically, refreshed to maintain the data stored in cells of the memory device is introduced. The memory device can be accessed by read/write operation and a refresh operation without any interference with each other. Such device can provide a very high speed accessing and the operating frequency of the memory device can be easily increased significantly.

To achieve the objective mentioned above, the present invention provides a memory device. The memory device has a plurality of memory cells, each of the memory cells is periodically refreshed to retain a data bit stored in the memory cell. An external clock is applied to the memory device for operation, a first operation clock and a second operation clock being generated by the external clock. The first operation clock is 180-degree phase shift to the second operation clock. The memory device comprises a first word line and a second word line, a first bit line and a second bit line, a first transistor and a second transistor and a storing unit. The first operation clock is applied to the first word line, the second operation clock is applied to the second word line. The first transistor is controlled by the first word line and the second transistor is controlled by the second word line. The storing unit is used for storing the data bit. The storing unit is connected to the first bit line through the first transistor. The first transistor allows the storing unit being connected to the first bit line in accordance with a logic status of the first operation clock. The storing unit is connected to the second bit line through the second transistor. The second transistor allows the storing unit being connected to the second bit line in accordance with a logic status of the second operation clock.

In the above-mentioned memory device, the first transistor and the second transistor are n-channel MOS (NMOS) transistors, and when the logic status of the first operation clock is in a logic high, the first transistor allowing the storing unit being connected to the first bit line, when the logic status of the second operation clock is in a logic high, the second transistor allowing the storing unit being connected to the second bit line.

In the above-mentioned memory device, the first transistor and the second transistor are p-channel MOS (PMOS) transistors, and when the logic status of the first operation clock is in a logic low, the first transistor allowing the storing unit being connected to the first bit line, when the logic status of the second operation clock is in a logic low, the second transistor allowing the storing unit being connected to the second bit line.

To achieve the objective mentioned above, the present invention provides a memory device. The memory device has a plurality of memory cells, each of the memory cells is periodically refreshed to retain a data bit stored in the memory cell. The memory device comprising a first word line and a second word line, a first operation clock being applied to the first word line, a second operation clock being applied to the second word line; a first bit line and a second bit line; a first transistor and a second transistor, wherein the first transistor is controlled by the first word line and the second transistor is controlled by the second word line; and a storing unit, for storing the data bit, the storing unit being connected to the first bit line through the first transistor, the first transistor allowing the storing unit being connected to the first bit line in accordance with a logic status of the first operation clock, the stored data bit being read out or being restored if the storing unit being connected to the first bit line; the storing unit being connected to the second bit line through the second transistor, the second transistor allowing the storing unit being connected to the second bit line in accordance with a logic status of the second operation clock, the stored data bit being refreshed if the storing unit being connected to the second bit line.

It is to be understood that both forgoing general description and the following detailed description are exemplary, and intended to provide further explanation of the invention as claimed.

BRIEF DESCRIPTION OF THE DRAWINGS

The accompanying drawings are included to provide a further understanding of the invention, and are incorporated in and constitute a part of this specification. The drawing illustrate embodiments of the invention and, together with the description, serve to explain the principles if the invention. In the drawings.

DESCRIPTION OF THE PREFERRED EMBODIMENT

As embodied in the invention, a 2-port memory device which is necessary periodically refreshed to maintain the data stored in cells of the memory device is introduced. The memory device can be accessed by read/write operation by one port and be refreshed by the other port. In such accessing way, two separate sensing and amplifying circuits are required for outputting the accessed data. By doing this, the memory device can perform a very high speed accessing and the operating frequency of the memory device can be easily increased significantly. For example, If the speed limit of the memory is x MHz, a 2x MHz access (interleaved between two ports) can be achieved. The memory device can be a DRAM, a SRAM, SRAM-like device, or others, which need high speed performance of accessing data and being periodically refreshed to maintain data stored therein.

Figure 1:
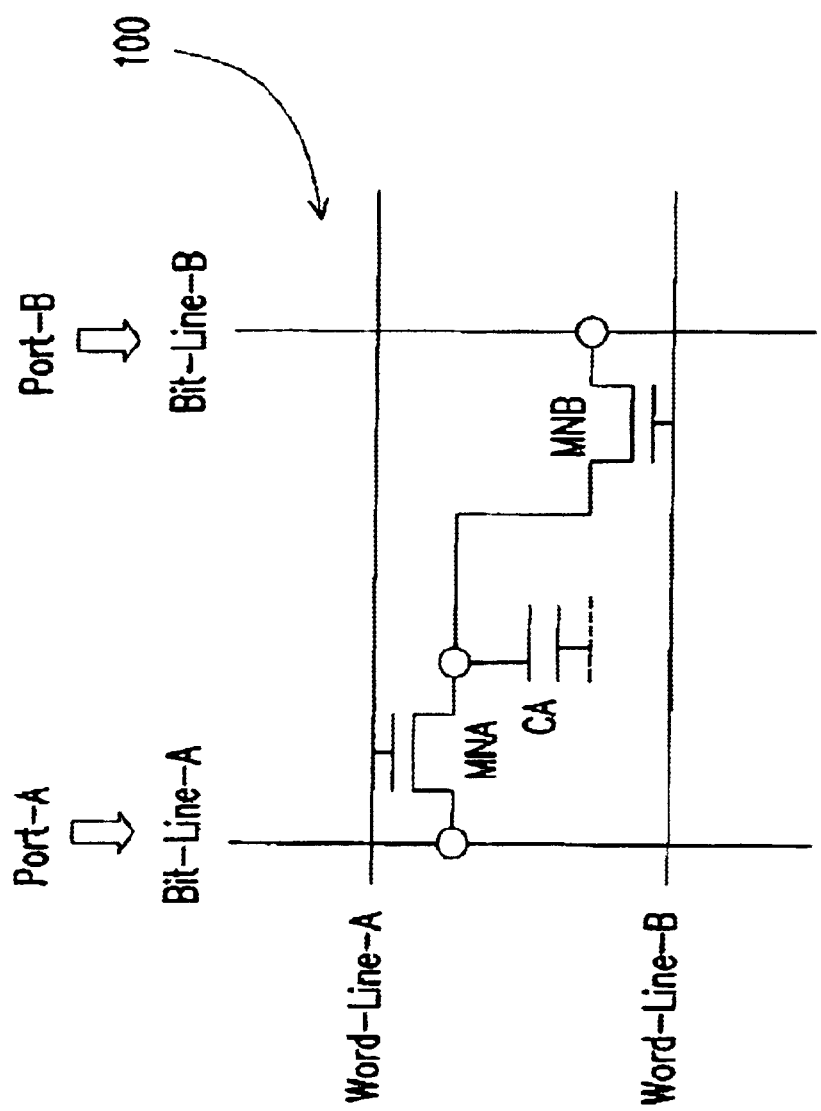
FIGS. 1–3 are memory cells of a memory device of a preferred embodiment of the present invention.
Figure 2:
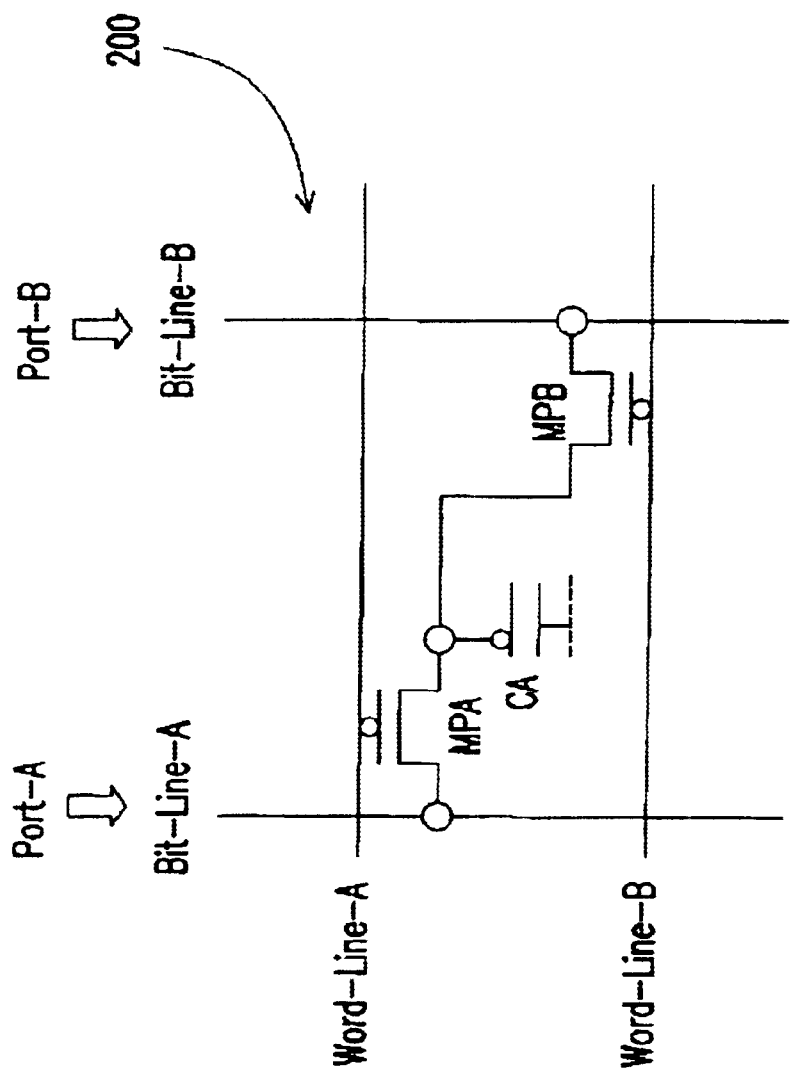
Figure 3:
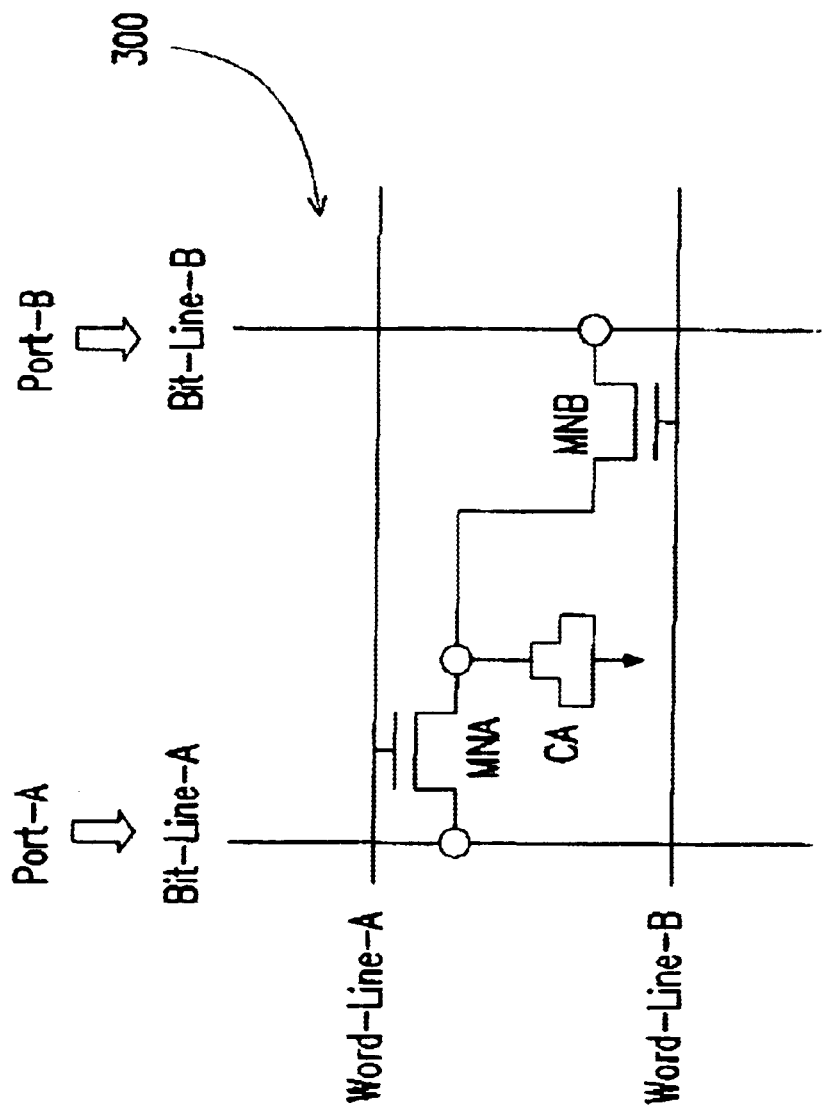

Referring to FIGS. 1–3, memory cells 100, 200 and 300 of the memory device of a preferred embodiment of the present invention are respectively described. The memory cells 100, 200 and 300 can be used for dynamical random access memory (DRAM) device, one-transistor statistic random access memory (SRAM), content addressable memory (CAM), or any kind of memory device which needs high speed performance of accessing data and being periodically refreshed to maintain data stored therein. In the memory cells 100, 200 and 300, two ports PORT A and PORT B are provided for data accessing and data refreshing. The memory cells 100, 200 and 300 are the dynamically storing memory cells with two transistors and one capacitor The capacitor CA, as shown in FIGS. 1 and 2, can be a capacitor made by DRAM process. Alternatively, as shown in FIG. 3, the capacitor CA can also be a MOS capacitors (MC) made by a pure logic process. These capacitors of different kinds are used for storing data in the memory cells. The capacitor can also be manufactured by a FRAM (Ferroelectric random-access memory) process or MIM (metal-insulator-metal) capacitor process, as desired.

These transistors, as shown in FIGS. 1 and 2 for n-channel MOS (NMOS) transistors MNA and MNB or as shown in FIG. 2 for p-channel MOS (PMOS) transistors MPA and MPB, are used for pass transistors, each of which is controlled respectively by a corresponding word line (Word-Line-A and Word-Line-B, as shown in the FIGS. 1 and 2). By addressing a selected bit line BL (Bit-Line-A and Bit-Line-B, as shown in the FIGS. 1 and 2) and the word line WL, the memory cell can be read, written or refreshed in accordance with requirements and designs. According to the invention, the alternative arrangement of using NMOS or PMOS transistors as passing transistors depends on design. Because the memory cells should be refreshed periodically for maintaining the stored data, there are some concerns that should be considered. A first consideration is trying to find out a solution for performing the read/write operation and the refresh operation without any interference with each other.

Figure 4:
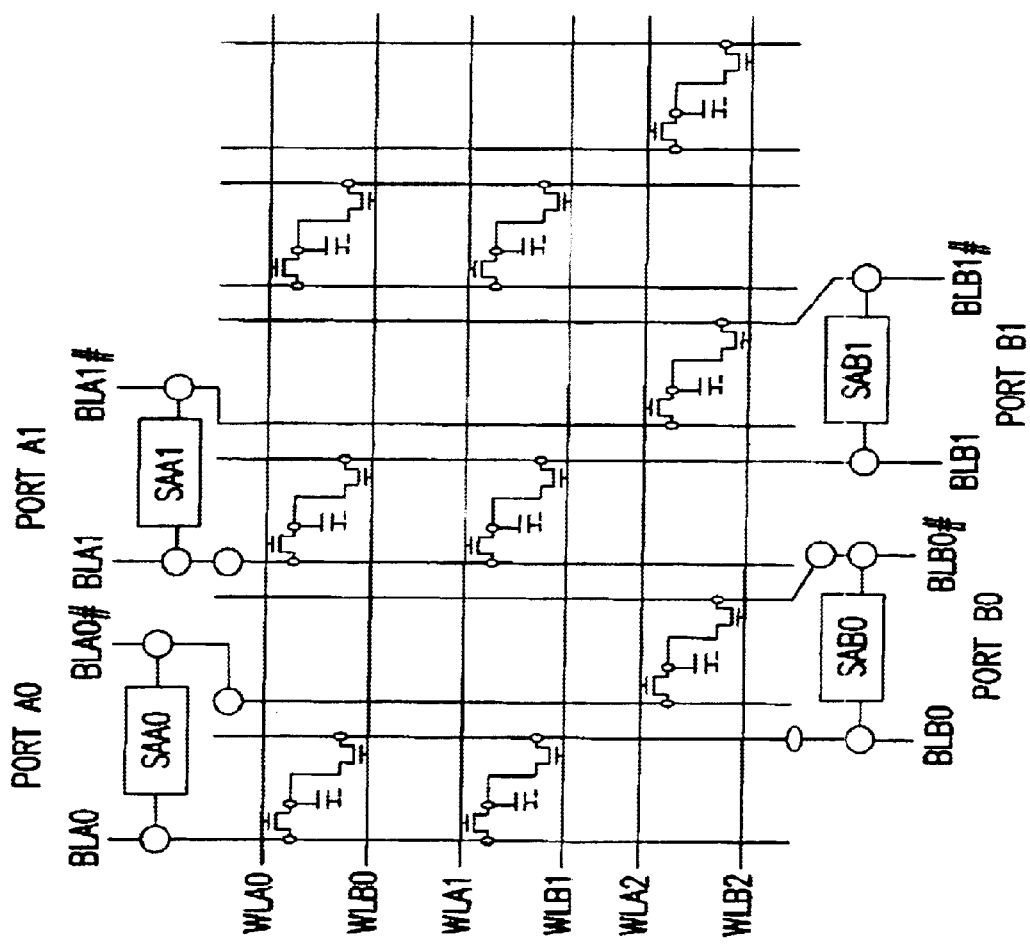
FIG. 4 is a memory array using the memory cells of FIGS. 1–3 of the invention.

Referring to FIG. 4, a memory array using the memory cells of the invention is introduced. A plurality of pairs of word lines WA0, WB0, WA1, WB1, WA2 and WB2 are arranged in the memory array. Two ports are arranged in the memory array for read/write and refresh operations of memory cells in each column of the memory array. The number of columns is determined by the design and each of the columns has its own two ports. In the embodiment, two pairs of ports A0, B0 and A1, B1 are described and shown in FIG. 4 as an example. The ports A0 and B0 are used respectively for read/write and refresh operation in the first column of the memory cells of the memory array. Ports A1 and B1 are used respectively for read/write and refresh operation in the first column of the memory cells of the memory array. If the ports A0 and A1 are used for read/write operation, the ports B0 and B1 are used for refresh operation. Alternatively, the ports B0 and B1 can be used for read/write operation if the ports A0 and A1 are used for refresh operation.

Figure 5:
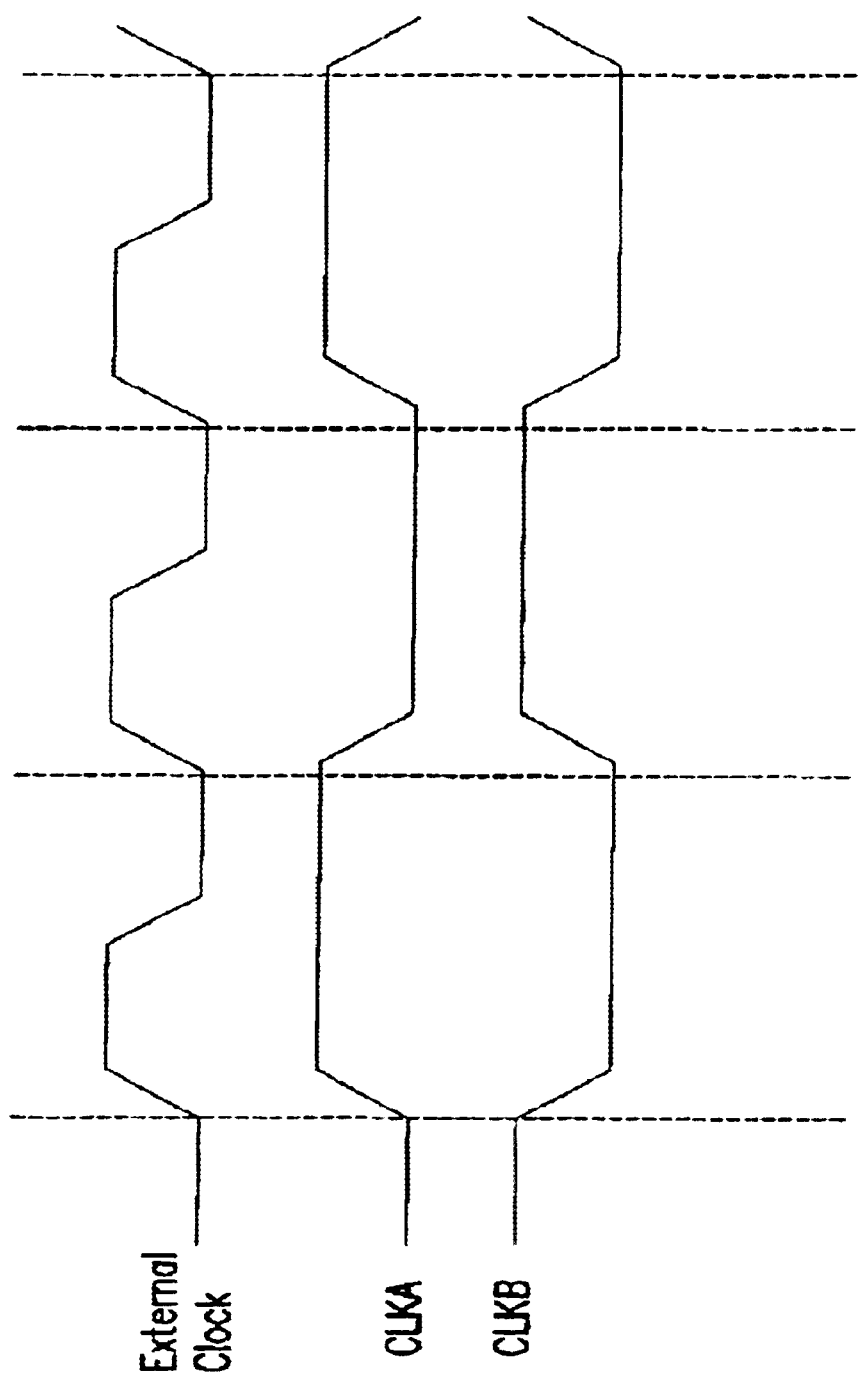
FIG. 5 is a waveform diagram of operation clocks applied to the memory cells of the memory array of FIG. 4.

Referring to FIG. 5, in considering the solution for performing the read/write operation and the refresh operation without any interference with each other, two operation clocks CLKA and CLKB are provided respectively through ports Ai (i=1,2, . . . ) and Bi (i=1,2, . . . ) for accessing the memory cells in the memory device, either for read/write operation or for refresh operation. These two clocks CLKA and CLKB have frequencies equal to, for example, half of a frequency of an external clock (External Clock in FIG. 5), which is provided for and received by the memory device. If the external clock is used for generating the two clocks CLKA and CLKB, it is easy to be implemented by dividing the frequency of the external clock into halves. The two clocks also can be provided by other resources in the memory device.

The CLKA and CLKB have a 180-degree phase shift to each other. That means that if the CLKA has 0 phase shift, the CLKB has a 180 degree phase shift. If the CLKA is used to access word lines WAi (i=1,2, . . . ), the CLKB is used for WBi (i=1,2, . . . ), as shown in FIG. 4 and i is column number of the memory array. In such accessing way, two separate sensing and amplifying (SA) circuits are required for outputting the accessed data. For example, as shown in FIG. 4, the sensing and amplifying circuits SAA0 for the port A0 and the sensing and amplifying circuits SAB0 for the port B0. The sensing and amplifying circuits SAA1 for the port A1 and the sensing and amplifying circuits SAB1 for the port B1.

By this way, the memory device can perform a very high speed accessing and the operating frequency of the memory device can be easily increased significantly. For example, If the speed limit of the memory is x MHz, a 2x MHz access (interleave between PORT A and PORT B) can be achieved. The memory device can be a DRAM, a SRAM, SRAM-like device, or others, which need high speed performance of accessing data. The memory device can be arranged by a memory array with corresponding sensing and amplifying circuits as shown in FIGS. 6 and 7.

Figure 6:
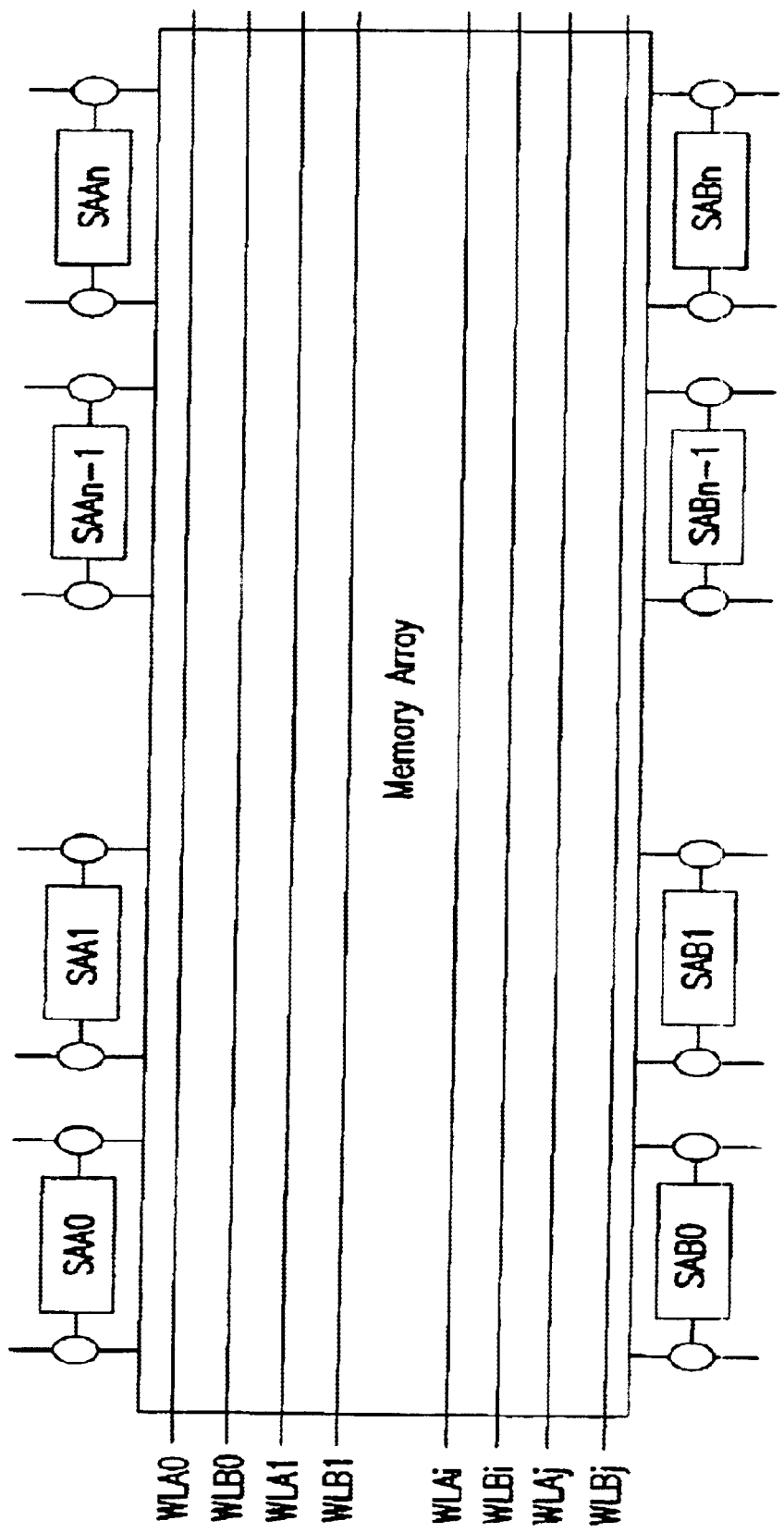
FIG. 6 is another memory array using the memory cells of the invention.
Figure 7:
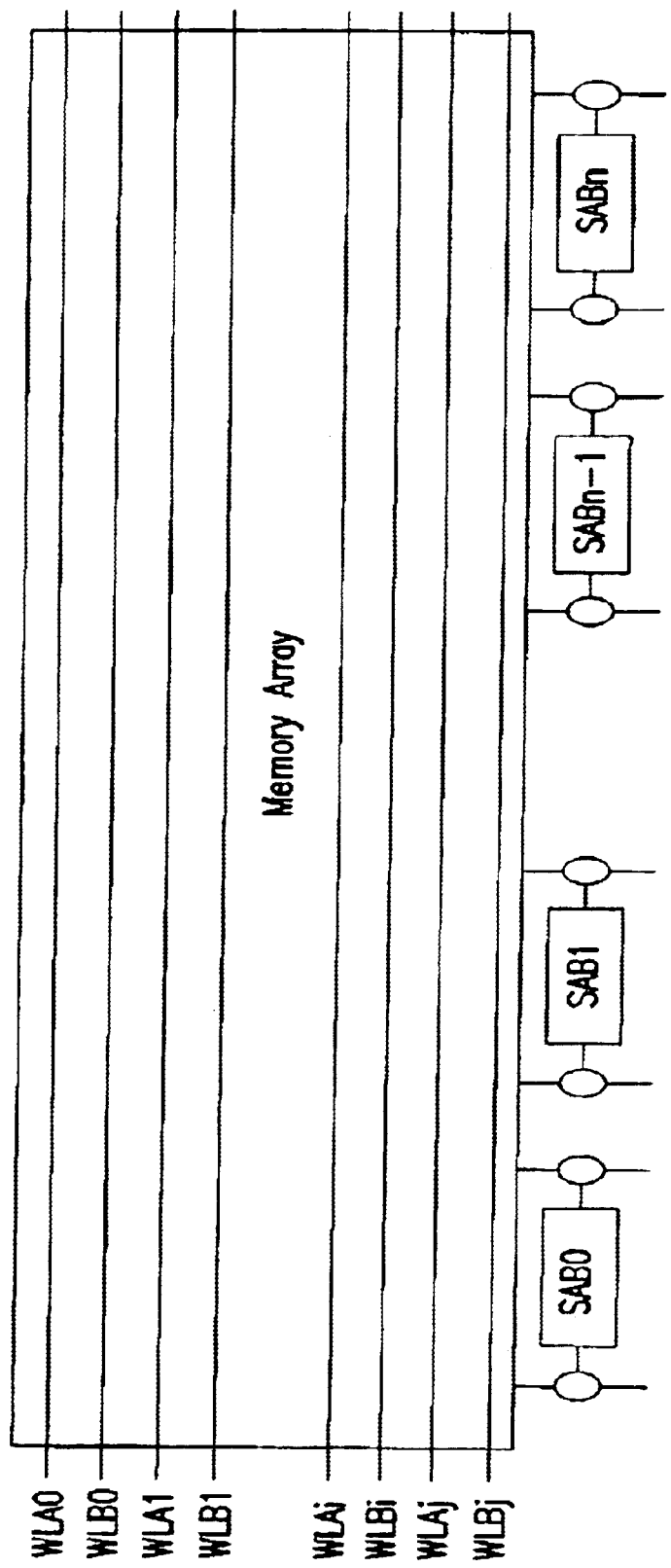
FIG. 7 is further memory array using the memory cells of the invention.

One arrangement with 2-port word lines can be one port word line for refresh and other port word line for read/write operation, which is shown in FIG. 6. One of the other arrangements with 2-port word lines can be one port word line for read operation and other port word line for write operation, while a wave-pipeline technique is used for refresh cycle (which means "hidden refresh"), which is shown in FIG. 7, for example. A further arrangements, as shown in FIG. 7, can be one port word line for read operation and other port word line for write operation, while idle a refresh period for refresh operation.

Figure 8:
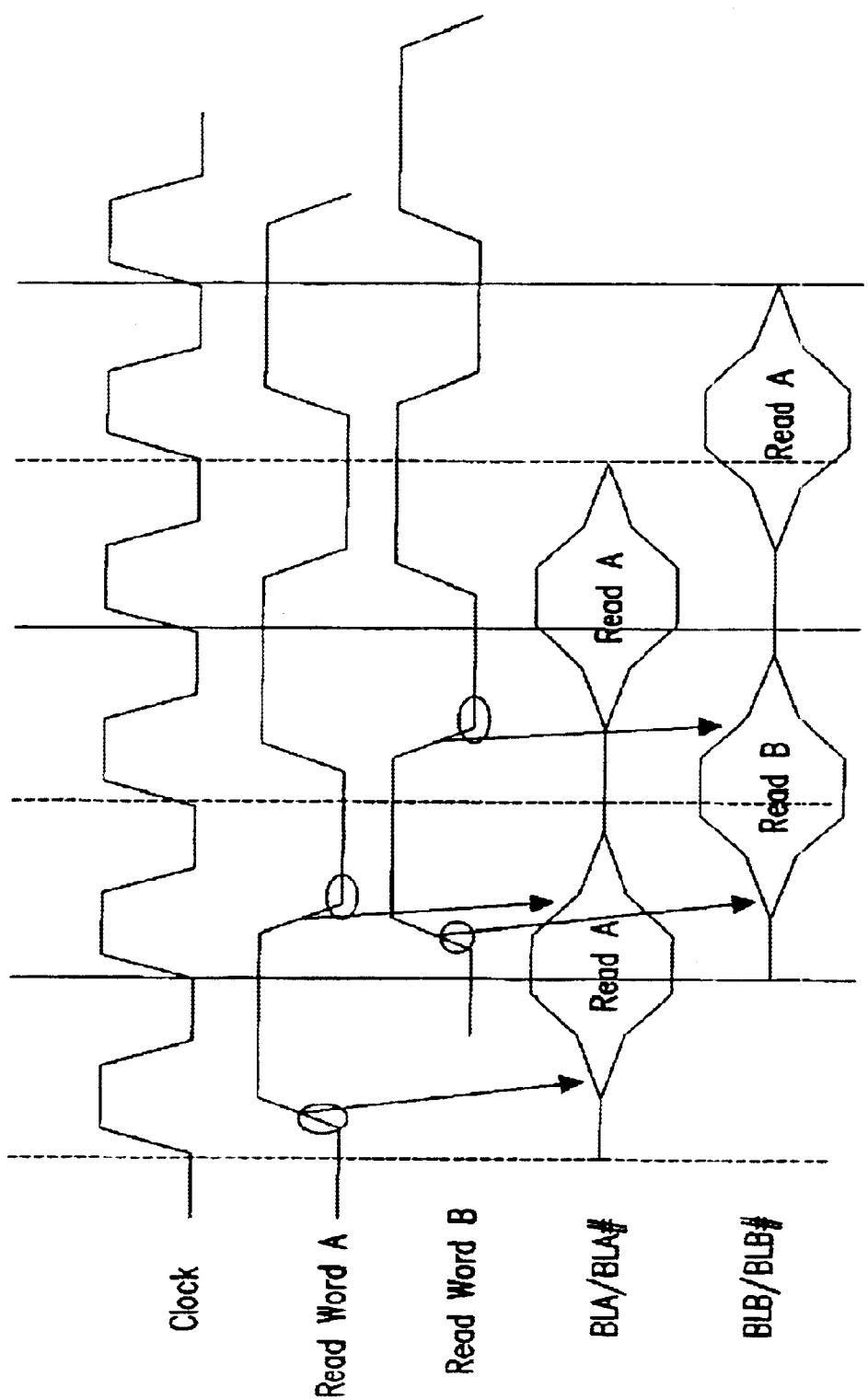
FIG. 8 is a waveform diagram of the timing of various signals during read/write and refresh operations in accordance with a DRAM device using memory cells of the invention.

Referring to FIG. 8, showing a waveform diagram of the timing of various signals during read/write and refresh operations in accordance with an embodiment of the invention. The description is introduced accompanying with FIG. 4. If the 2-port memory device is used for DRAM, using read operation as an example, a CLKA clock is applied to word lines WAi (i=1,2, . . . ) for read, the CLKB clock is applied to WBi (i=1,2, . . . ) also for read. The CLKB has a 180 degree phase shift compared with CLKA. Data stored in according with an accessing address is read out by the pair of bit line BLAi and BLAi# (i=1,2, . . . ) in a first period of one clock cycle. Data stored in according with another accessing address is read out by the pair of bit line BLBi and BLBi# (i=1,2, . . . ) in a second period of one clock cycle followed with the first period. In such way, if the speed limit of the memory is x MHz, a 2x MHz access speed can be achieved.

Figure 9:
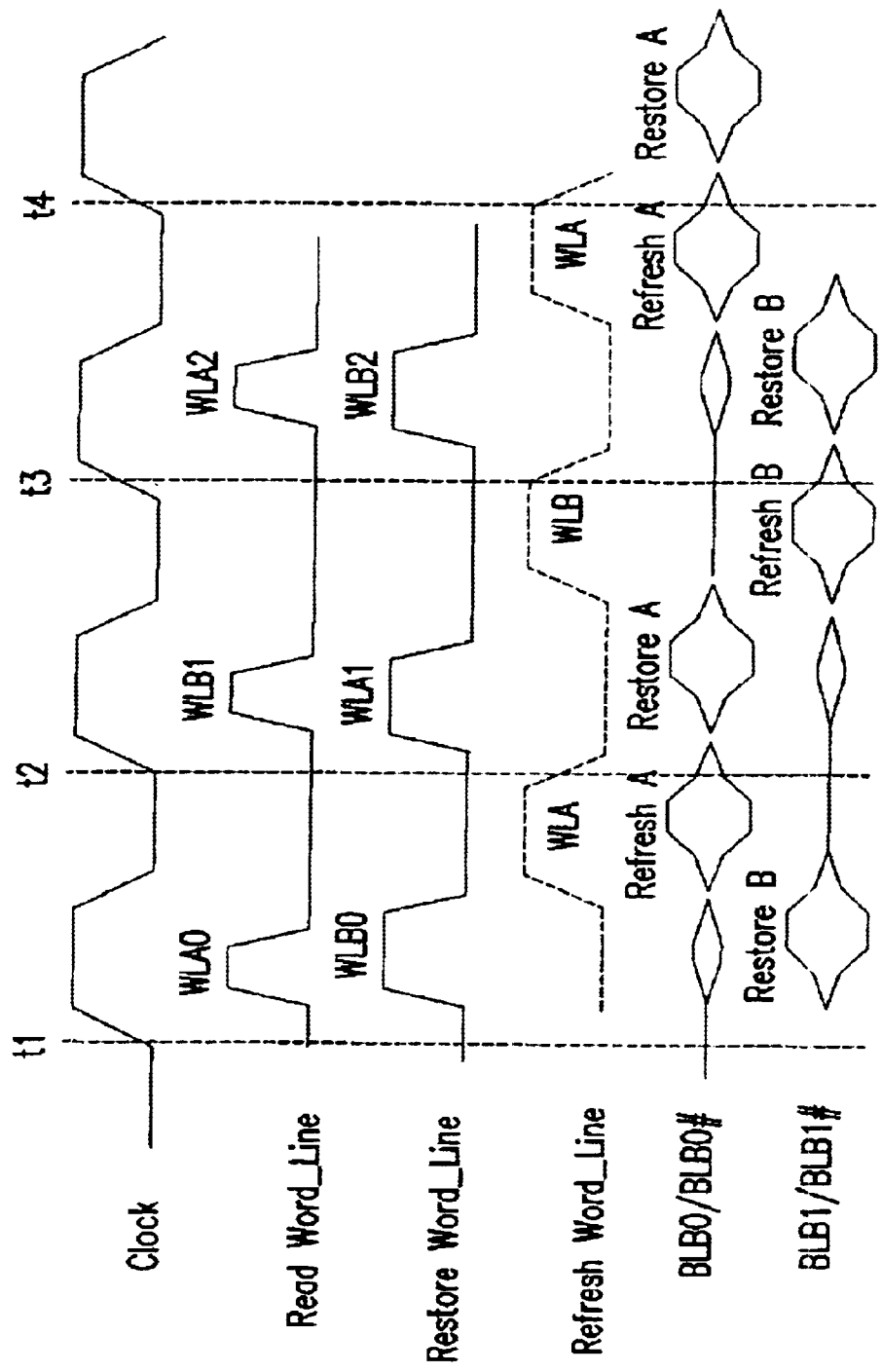
FIGS. 9 and 10 are waveform diagrams of the timing of various signals during read/write and refresh operations in accordance with a 1-T SRAM using memory cells of the invention.
Figure 10:
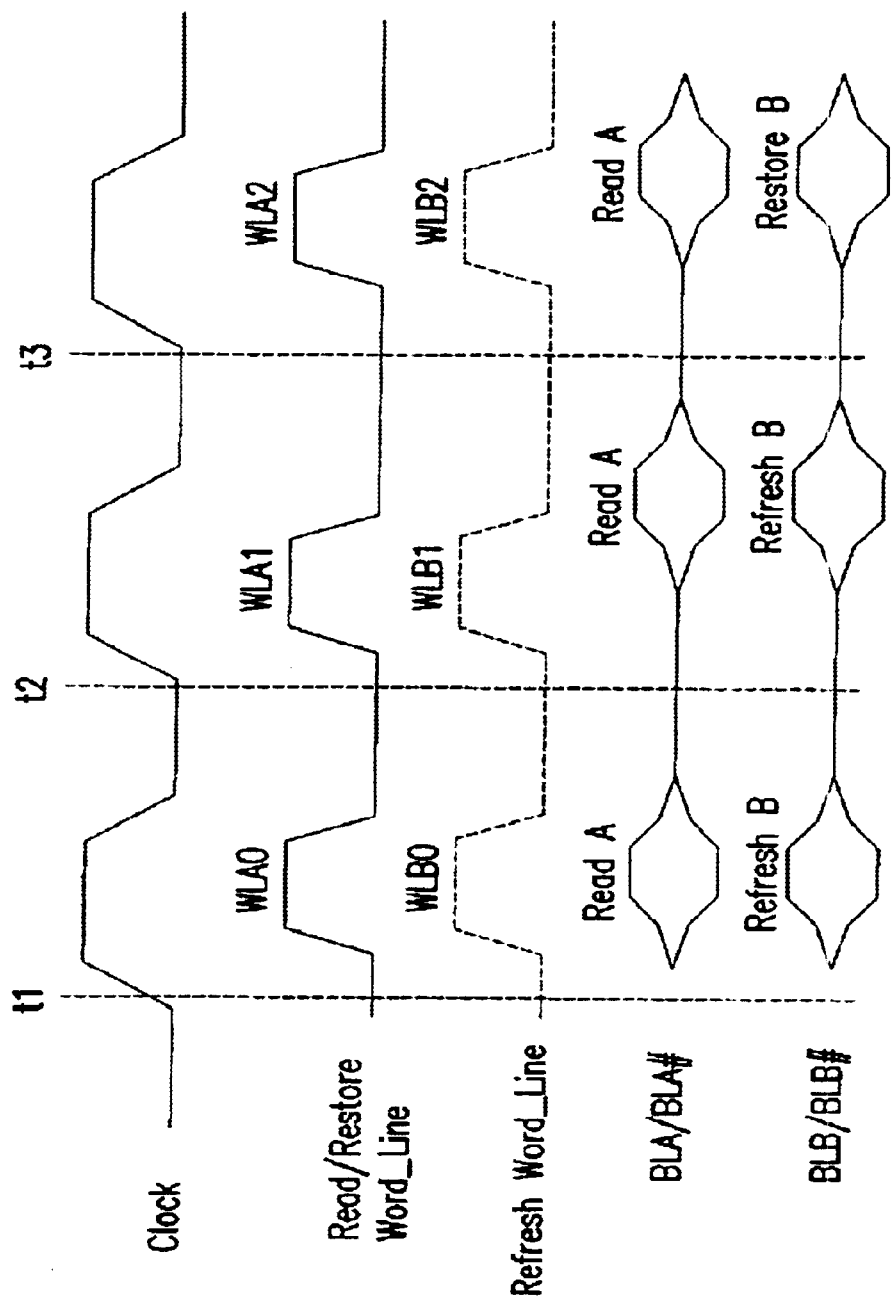
Figure 11:
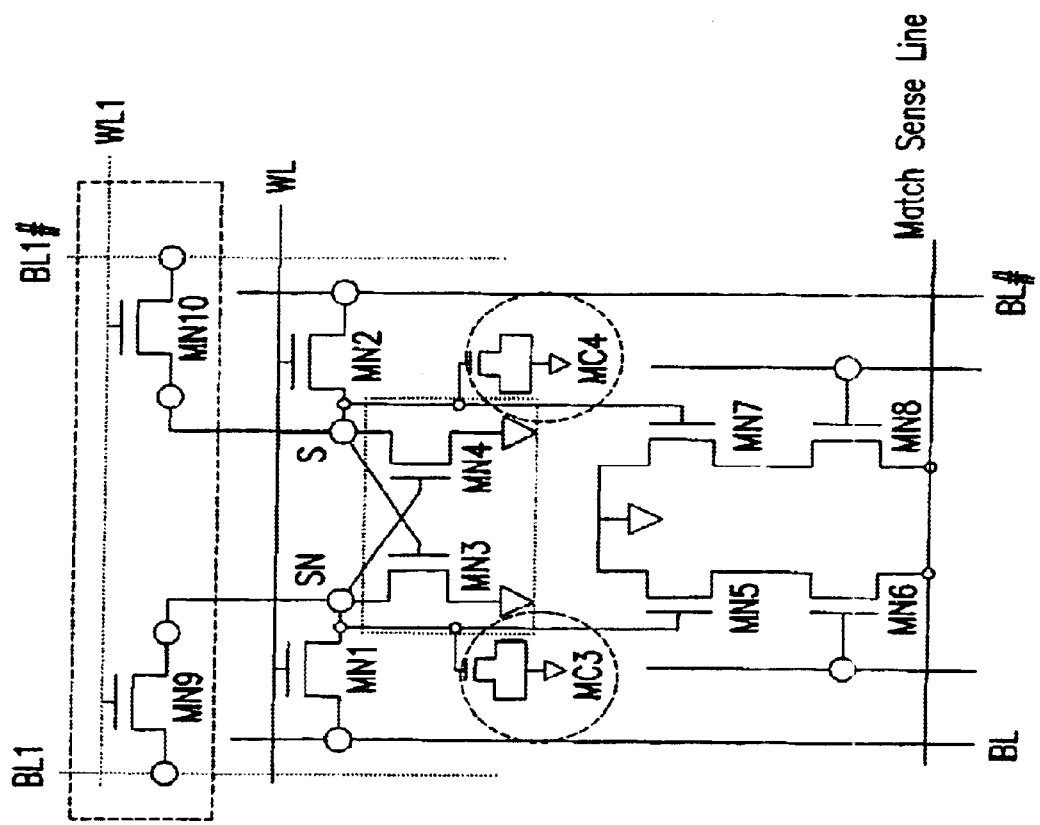
FIG. 11 is a content addressable memory (CAM) device with a 2-port word lines and 2-port bit lines in accordance with the preferred embodiment of the invention.

Referring to FIGS. 9, 10 and 11, respectively showing a waveform diagram of the timing of various signals during read/write and refresh operations in accordance with another embodiment for a synchronous or an asynchronous SRAM device with one transistor ("1-T SRAM") of the invention. It is introduced by accompanying with FIG. 4. The operation method of the 1-T SRAM is described with details in a co-pending U.S. patent application titled "OPERATION METHOD OF A SRAM DEVICE" filed on Jan. 14, 2002, Ser. No. 10/047,765, all disclosures are incorporated herein. One arrangement with 2-port word lines can be one port word line for refresh and other port word line for read/write operation. One of the other arrangements with 2-port word lines can be one port word line for read operation and other port word line for write operation, while a wave-pipeline technique is used for refresh cycle (which means "hidden refresh"). One of the other arrangements with 2-port word lines can be one port word line for read operation and other port word line for write operation, while idle a refresh period for refresh operation.

The latter case above in which one port word line for read operation and other port word line for write operation, while idle a refresh period for refresh operation is shown in FIG. 9. During a first clock cycle from t1 to t2, within a former period of the first clock cycle, word line WA0 is read and word line WB0 is restored simultaneously. During a latter period of the first clock cycle, refresh operation is implemented through word line WA0. The former period is sufficient enough to implement the read or restore operation and the latter period is sufficient enough to implement the refresh operation. During a second clock cycle from t2 to t3, within a former period of the second clock cycle, word line WB1 is read and word line WA1 is restored simultaneously. During a latter period of the second clock cycle, refresh operation is implemented through word line WB1. During a third clock cycle from t3 to t4, within a former period of the third clock cycle, word line WA2 is read and word line WB2 is restored simultaneously. During a latter period of the third clock cycle, refresh operation is implemented through word line WA2.

The former case above in which one port word line for refresh and other port word line for SRAM read/write operation is described in FIG. 10. During a first clock cycle from t1 to t2, word line WA0 is read/written data and word line WB0 is refreshed. During a second clock cycle from t2 to t3, word line WA1 is read/written data and word line WB1 is refreshed. During a third clock cycle from t3 to t4, word line WA2 is read/written data and word line WB2 is refreshed.

Referring to FIG. 11, showing a content addressable memory (CAM) device with a 2-port word lines and 2-port bit lines built therein. The CAM device is implemented by 1-T SRAMs. The CAM cell stored one bit of data, but the data is stored differentially as true and complement data. The stored data both true terminal and complement terminals, S and SN as shown in the FIG. 11 for example, are all "0," it means that the CAM cell is in a status of "Don't Care." The embodiment relates to a CAM cell using three ports for operations (Two-port word line and One-port bit line, or Two-port word line and Two-port bit line), depending on requirements. One arrangement with two-port word line can be: (i) one port for refresh and other port for SRAM write operation, (ii) one port for read operation and other port for write operation, while a wave-pipeline technique for refresh cycle (which means hidden refresh), or (iii) one port for read operation and other port for write operation, while idle a refresh cycle for such dynamic CAM cell. One arrangement with two-port bit line can be: (i) Match operation and Read/Write operation can be performed in the same cycle, while a wave-pipeline technique for refresh cycle (which means hidden refresh), or (ii) Match operation and Read/Write operation can be performed in the same cycle, while idle one cycle for refresh. One arrangement with two-port bit line and two-port word line can be: (i) one word-line port for refresh and the other word-line port for SRAM write operation, while the Match operation can be performed in the same cycle; (ii) one word-line port for read operation and the other word-line port for write operation, while a wave-pipeline technique for hidden refresh is used for a refresh cycle (which means hidden refresh) and Match operation is performed in the same cycle; or (iii) one word-line port for read operation and the other word-line port for write operation, while Match operation is performed in the same cycle and idle a refresh cycle for refresh operation (for dynamic CAM cells). Such 3-port dynamic differential CAM cells can be implemented by any CMOS technologies, such as FRAM, DRAM, logic technology, etc. These CAM cells can be combined and modified in accordance with different purposes. These different types of CAM cells are described hereafter.

Refer to FIG. 11, a pair of bit lines BL and BL# carry true and complement data to a column of cells. Two pass transistors MN1 and MN2 are turned on when word line WL is driven with a high voltage during a write operation. The pass transistor MN1 connects bit line BL to the gate of storage transistor MN4 and capacitor MC3. Pass transistors MN2 connects bit line BL# to the gate of storage transistors MN3 and capacitor MC4. One gate is charged high while the other gate is charged low. The capacitors MC3 and MC4 can be MOS capacitors, which meet the requirements of the manufacturing process. Operations of such 3-port CAM cell are familiar with the operations described in FIG. 8 except a separate pair of bit lines BL1 and BL1# and an additional word line WL1 are provided in this type of CAM cell of the third preferred embodiment of the invention.

As described above, these two word lines can be arranged as followed. In a case that if word line WL is used for SRAM write operation, the other word line WL1 is used for refresh. In another case that if word line WL is used for write operation, the other word line WL1 is used for read operation, while a wave-pipeline technique is used for refresh cycle (which means hidden refresh). In further case that if word line WL is used for write operation, word line WL1 is used for read operation, while idle a refresh cycle for such dynamic CAM cell. As describe above, there bit lines can be arranged as followed. In a case that Match operation and Read/Write operation can be performed in the same cycle through different pair of bit lines, while a wave-pipeline technique for refresh cycle (which means hidden refresh). In other case that Match operation and Read/Write operation can be performed in the same cycle through different pair of bit lines, while idle one cycle for refresh.

For combing these arrangements together, which means two pairs of bit lines BL, BL# and BL1, BL1#, and two word lines WL, WL1 are provided. These features described above for two-pair bit lines and two word lines can be incorporated together for different purposes. For example, if word line WL is used for SRAM write operation, the other word line WL1 is used for refresh. The Match operation can be performed in the same cycle when write operation and refresh operation are performed. Another arrangement can also that if word line WL is for write operation, the word line WL1 is for read operation, while a wave-pipeline technique for hidden refresh is used for a refresh cycle (which means hidden refresh) and Match operation is performed in the same cycle. Another choice of arrangement is that if the word line WL is for write operation, the other word line WL1 is for read operation, while Match operation is performed in the same cycle and idle a refresh cycle for refresh operation (for dynamic CAM cells).

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A memory device, the memory device having a plurality of memory cells, each of the memory cells being periodically refreshed to retain a data bit stored in the memory cell, an external clock being applied to the memory device for operation, a first operation clock and a second operation clock being generated by the external clock, the first operation clock being 180-degree phase shift to the second operation clock, the memory device comprising:

a first word line and a second word line, the first operation clock being applied to the first word line, the second operation clock being applied to the second word line;

a first bit line and a second bit line;

a first transistor and a second transistor, wherein the first transistor is controlled by the first word line and the second transistor is controlled by the second word line; and a storing unit, for storing the data bit, the storing unit being connected to the first bit line through the first transistor, the first transistor allowing the storing unit being connected to the first bit line in accordance with a logic status of the first operation clock, the storing unit being connected to the second bit line through the second transistor, the second transistor allowing the storing unit being connected to the second bit line in accordance with a logic status of the second operation clock.

2. A memory device of claim 1, wherein the first transistor and the second transistor are n-channel MOS (NMOS) transistors, and when the logic status of the first operation clock is in a logic high, the first transistor allowing the storing unit being connected to the first bit line, when the logic status of the second operation clock is in a logic high, the second transistor allowing the storing unit being connected to the second bit line.

3. A memory device of claim 1, wherein the first transistor and the second transistor are p-channel MOS (PMOS) transistors, and when the logic status of the first operation clock is in a logic low, the first transistor allowing the storing unit being connected to the first bit line, when the logic status of the second operation clock is in a logic low, the second transistor allowing the storing unit being connected to the second bit line.

4. A memory device of claim 1, wherein the storing unit is a capacitor.

5. A memory device of claim 1, wherein the capacitor is a MOS capacitor (MC) made by a logic process.

6. A memory device of claim 1, wherein the capacitor is a capacitor (MC) made by a MIM (metal-insulator-metal) capacitor.

7. A memory device, the memory device having a plurality of memory cells, each of the memory cells being periodically refreshed to retain a data bit stored in the memory cell, the memory device comprising:

a first word line and a second word line, a first operation clock being applied to the first word line, a second operation clock being applied to the second word line;

a first bit line and a second bit line;

a first transistor and a second transistor, wherein the first transistor is controlled by the first word line and the second transistor is controlled by the second word line; and a storing unit, for storing the data bit, the storing unit being connected to the first bit line through the first transistor, the first transistor allowing the storing unit being connected to the first bit line in accordance with a logic status of the first operation clock, the stored data bit being read out or being restored if the storing unit being connected to the first bit line;

the storing unit being connected to the second bit line through the second transistor, the second transistor allowing the storing unit being connected to the second bit line in accordance with a logic status of the second operation clock, the stored data bit being refreshed if the storing unit being connected to the second bit line.

\* \* \* \* \*